(12) United States Patent
Sutardja

(10) Patent No.: US 12,316,315 B2
(45) Date of Patent: May 27, 2025

(54) NOISE TOLERANT BUFFER

(71) Applicant: Sehat Sutardja, Las Vegas, NV (US)

(72) Inventor: Sehat Sutardja, Las Vegas, NV (US)

(*) Notice: Subject to any disclaimer, the term of this patent is extended or adjusted under 35 U.S.C. 154(b) by 0 days.

(21) Appl. No.: 18/132,294

(22) Filed: Apr. 7, 2023

(65) Prior Publication Data

US 2023/0327669 A1 Oct. 12, 2023

Related U.S. Application Data

(60) Provisional application No. 63/328,673, filed on Apr. 7, 2022.

(51) Int. Cl.
*H03K 17/16* (2006.01)
*H03K 19/003* (2006.01)

(52) U.S. Cl.
CPC ..... *H03K 19/00315* (2013.01); *H03K 17/162* (2013.01); *H03K 19/00361* (2013.01)

(58) Field of Classification Search
CPC .... H03K 17/16; H03K 17/162; H03K 19/003; H03K 19/00315; H03K 19/00361
USPC ........................................... 327/306
See application file for complete search history.

(56) References Cited

U.S. PATENT DOCUMENTS

| | | | | |
|---|---|---|---|---|
| 5,128,567 A | * | 7/1992 | Tanaka | H03K 19/00361 327/437 |
| 5,231,311 A | * | 7/1993 | Ferry | H03K 19/00361 326/86 |
| 2007/0057703 A1 | | 3/2007 | Kumar et al. | |
| 2008/0291588 A1 | | 11/2008 | Kanai | |
| 2013/0278191 A1 | | 10/2013 | Zushi et al. | |
| 2016/0241174 A1 | | 8/2016 | Hisamatsu et al. | |
| 2020/0212917 A1 | | 7/2020 | Zerbe et al. | |

* cited by examiner

*Primary Examiner* — William Hernandez
(74) *Attorney, Agent, or Firm* — Command IP LLP; Pejman Yedidsion

(57) ABSTRACT

A noise tolerant buffer circuit, configured to interface a controller to a switching device, that includes an input, a first buffer, a second buffer, an output, and a switching device. The input provides a control signal to the first buffer cell input. The first buffer cell processes the control signal to generate a second buffer output. The second buffer cell processes the output of the first buffer to generate a second buffer output. The switching device is configured to receive an output of the second buffer and perform a switching operation based on the output of the second buffer. The switching operation generates noise that couples back to the first buffer cell and the second buffer cell, and the noise is divided between the first buffer cell and a second buffer to thereby reduce the noise to a value that does not trigger the first buffer or the second buffer.

20 Claims, 4 Drawing Sheets

NOISE TOLERANT BUFFER

1. FIELD OF THE INVENTION

The innovation related to buffers and in particular to a noise tolerant buffer circuit.

2. RELATED ART

A digital buffer is a fundamental circuit element used in numerous different types of electronic circuits. For example, a computer chip could have millions or even billions of buffers. However, in high speed and/or high current applications, such as in high-power power supplies and motor applications, the switching noise generated by the parasitic inductances that are inherent in any power device and associated connecting wires causes false/unintended switching events of the power devices. These false or unintended switching events often result in catastrophic failures, in the worst case, or major efficiency losses in the best case.

The prior art solution adopted to overcome these false switching events is to simply increase the threshold voltage of the power switching devices and utilize higher voltage digital buffers to drive these power switching devices. However, in many situations, there is a limit to the amount supply voltage increase applied to the buffers, thus limiting the use of this prior art solution. There are other drawbacks associated with this prior art solution.

Another prior art solution is to slow down the switching speed of the buffers driving these power devices using a series connected resistor 112. This prior art solution is illustrated in FIG. 1. FIG. 1 is a circuit diagram of a prior art buffer circuit with series connected resistor 112. An input 104 receives an input signal which is provided to a buffer 108. Power is supplied to the buffer from a voltage node Vdd 128. The output of the buffer 108 connects to a resistor 112, which in turn connects to a switching power device 116. A load is connected to the output terminal 124 of the switching power device 116 as shown. The buffer 108 and the switching power device 116 share the same ground node 120.

The resistor 112 connects between the digital buffer 108 and the gate of the switching device 116. The resistor 112 is used to slow down the switching slew rate of the switching device 116. This drastically reduces the noise generated by the parasitic inductances 138 from wire connections or the switching device 116. If the switching speed is slowed down enough, eventually the magnitude of the noise would be low enough to prevent false triggering of the buffer 108. Unfortunately, slowing the switching speed of the switching device 116 limits the switching frequency of the associated power electronics or other device. In power supply applications, this results in bulkier magnetic components which ultimately translates into higher overall product cost. It also reduces switching speed, which results in lower efficiency.

SUMMARY

To overcome the drawbacks of the prior art and provide additional benefits, a noise tolerant switching system is disclosed that comprises an input configured to receive a control signal and a buffer chain. The buffer chain comprises a first buffer cell configured to receive the control signal such that the first cell connects to a voltage supply rail and a ground rail. Also included in the buffer chain is one or more additional buffer cells arranged in series after the first buffer cell, such that the one or more additional buffer cells receive a buffer cell output from a prior buffer cell, and each of the one or more additional buffer cells are connected to the voltage supply rail and the ground rail. A final buffer cell of the one or more additional buffer cells outputs a switch control signal. A switching device has an output terminal and a ground connection to the ground rail. The switching device is configured to receive the switch control signal from the final buffer cell, such that during switching of the switching device, switching noise couples into the ground rail and the switching noise is divided between the buffers in the first buffer cell and the one or more additional buffer cells to thereby reduce the noise presented to each buffer.

In one embodiment, the first buffer cell and the one or more additional buffer cells each comprise a ground rail resistor connected in series in the ground rail, and a supply voltage rail resistor connects in series in the voltage supply rail. The switching noise is divided between the ground rail resistors, the supply rail resistor, or both in the buffer cells to thereby reduce the switching noise experienced by the buffer cells. In one configuration, the switching device comprises a FET. It is contemplated that the switching system may parasitic inductance from the connection between the switching device ground and the ground rail. The switch control signal may be received from a processor or a controller. The buffer chain performs impedance matching between the processor or controller and the switching device.

Also disclosed is a method for operating a switching device in an environment having noise on a ground rail comprising providing: a buffer chain having two or more series connected buffers, a buffer chain input configured to receive a switching control signal, a ground rail with two or more series connected ground rail resistors, and a voltage supply rail with two or more series connected voltage supply rail resistors, capacitors connected between the voltage supply rail and the ground rail, and a switching device having a control terminal connected to an output of a last buffer in the buffer chain to provide the apparatus to practice the invention. The method also includes receiving a switch control signal at an input of the buffer chain and processing the switch control signal through the buffer chain. Then, presenting the switch control signal to the control terminal of the switching device and responsive to the switching control signal, turning on and off the switching device to generate an output signal wherein the switching generates noise that couples onto the ground rail. The buffers divide the noise, based the number of ground rail resistors, between the ground rail resistors to thereby reduce the noise exposure to each of the buffers in the buffer chain.

In one embodiment, the buffers in the buffer chain perform impedance matching between the switching device and a device which generates the switch control signal. In one configuration, at least one ground rail resistor is associated with each buffer, at least one supply voltage rail resistor is associated with each buffer, and at least one capacitor is associated with each buffer. The switching device may comprise a transistor. The number of buffer cells (and number of resistors associated with teach buffer cell) in the buffer chain is sufficient to establish that a noise magnitude, generated by the switching, divided by the number of buffers is less than a turn on voltage of the buffers. The output signal may be pulse width modulated by the switch control signal.

Also disclosed is a noise tolerant buffer circuit configured to interface a controller to a switching device comprising an input configured to receive a control signal such that the control signal functions as a control signal for a switching device. A first buffer cell, having a first buffer cell input and a first buffer cell output, is configured to receive and process the control signal to generate a first buffer cell output. A second buffer cell has a second buffer cell input and a second buffer cell output such that the second buffer cell is configured to receive and process the first buffer cell output to generate a second buffer cell output. Also part of this circuit is a switching device configured to receive and perform a switching operation based on second buffer cell output. The switching operation generates noise that couples back to the first buffer cell and the second buffer cell, and the noise is divided between the first buffer cell and a second buffer to thereby reduce the noise to a magnitude that does not inadvertently or falsely trigger the first buffer cell or the second buffer cell.

The circuit may further comprise one or more additional buffer cells which further divide the noise to a magnitude that does not trigger the first buffer, the second buffer, or the one or more additional buffers. The first buffer cell and the second buffer cell may comprise a first buffer cell input configured to receive a control signal from a controller, a buffer configured to impedance match between the controller and the switching device such that the buffer connects to a voltage supply rail and a ground rail, a ground rail attenuation element series connected in the ground rail, a voltage supply attenuation element series connected in the voltage supply rail, and a first buffer cell output. The controller may comprise a processor that is unable to directly connect to the switching device due to impedance mismatch. The circuit may further comprise one or more additional buffer cells, wherein the total number of buffer cells is sufficient to establish a noise magnitude, generated by the switching, divided by the number of buffers, be less than a turn on voltage of the first buffer cell, the second buffer cell, and the one or more additional buffer cells. The switching device is a FET or any other type of switching element.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
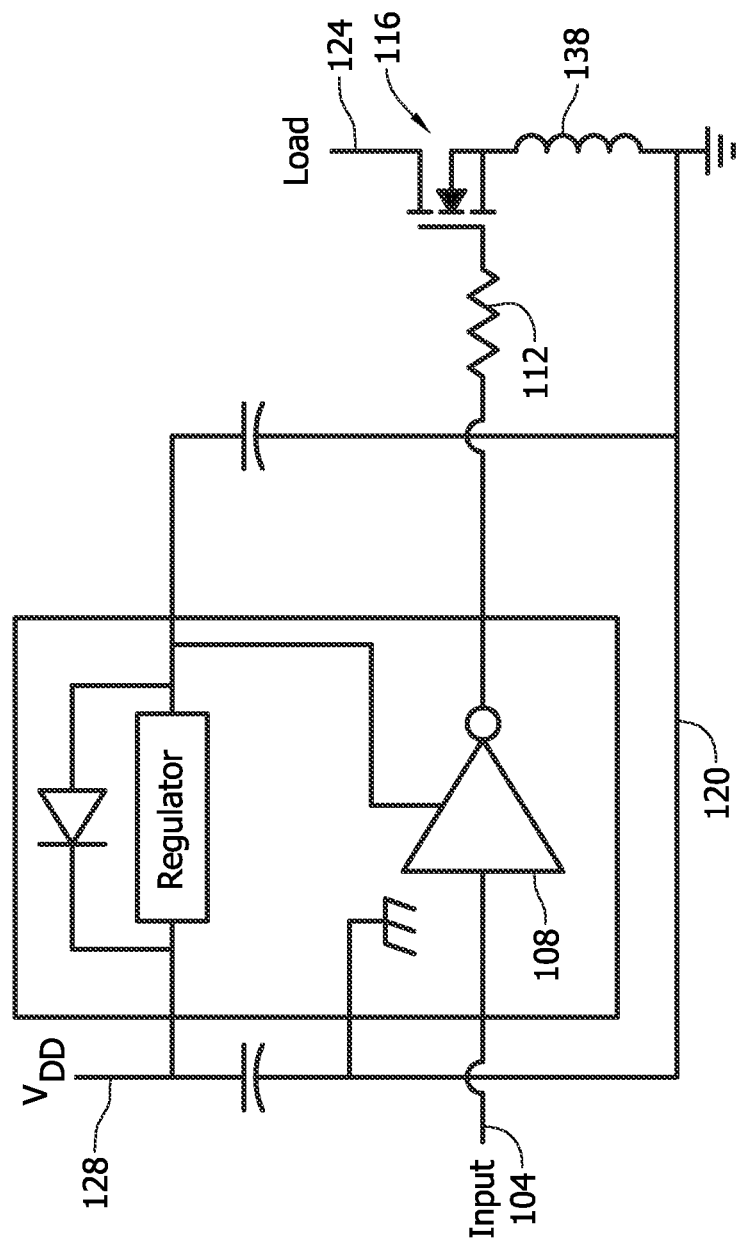
FIG. 1 is a circuit diagram of a prior art buffer circuit with series connected resistor.

To overcome the drawbacks of the prior art and provide additional benefits, proposed is a buffer circuit constructed with a cascaded digital buffer chain having the negative and positive power supply pins of the individual digital buffer connected to the power supply pins of the subsequent buffer. Due to the disclosed structure, the noise that is generated by the power switching device (or other sources), which connects to the output of the cascaded digital buffer, is divided between the buffer stages that form the chain, thereby presenting a smaller noise value and a higher signal to noise ratio at each buffer. This prevents or reduces false triggering of the buffers due to noise.

More importantly, the noise seen by the previous stage buffer would be incrementally smaller and this effectively increases the common mode rejection of the overall buffer chain. Establishing two or more stages in the buffer chain significantly reduces the noise seen by each stage of the buffer chain. For example, a buffer chain of ten (10) inverter/buffer stages would result is each buffer stages seeing only $\frac{1}{10}^{th}$ of the noise generated by the switching power device. This noise reduction prevents the noise from triggering a switching event at a buffer, which in turn prevents erroneous switching of the switching power device. In this example, if the gate voltage is at 5 volts, then the ringing noise magnitude can reach 10 volts at the source terminal and this 10 volt swing often couples into the ground rail. This coupled noise component can cause the FET (switching device) to turn on. A typical buffer can reject about 50% of its power supply level when seen as noise. As a result, each buffer can accurately operate while seeing ~2.5 volts of noise. However, due to noise coupling in this example discussion, one buffer could be exposed to a 0 to 10 volt swing, which would inaccurately trigger a low to high transition. This is problematic though because for a typical 5 volt supply voltage, a typical buffer can maintain accurate operation when experiencing up to 2.5 volts of noise.

Using the disclosed innovation, if the 10 volt voltage swing is dissipated across 10 resistors (attenuation elements) then the voltage across each resistor is only ~1 volt, which is far below the 2.5 volt limit, ensuring ideal operation of each buffer. Thus, each buffer only sees 1 volt of noise. Of course, in this example embodiment, a fewer number of buffers may be used, or a greater number of buffers may be used. The number of buffers and resistors in the chain may be adjusted based on the worst case scenario for expected noise. Numerous applications would benefit from this solution including, but not limited, to GaN MOSFET switching.

One field that will benefit from this disclosed innovation is an application that switches large current outputs. For example, electric vehicles use PWM (pulse width modulation) to control the speed and acceleration of the electric vehicle. In an electric vehicle, the processor, based on user throttle position input, generates a control signal used to control the switching of a power transistor, which in turn controls duty cycle. In the example environment of an electric vehicle, the power required to propel the vehicle is greater, resulting in a larger source to drain voltage. For example, the current output of a higher performance electric vehicle is over 1200 amps, assuming a 400 volt nominal battery configuration. The noise created during switching is significant.

Figure 2:
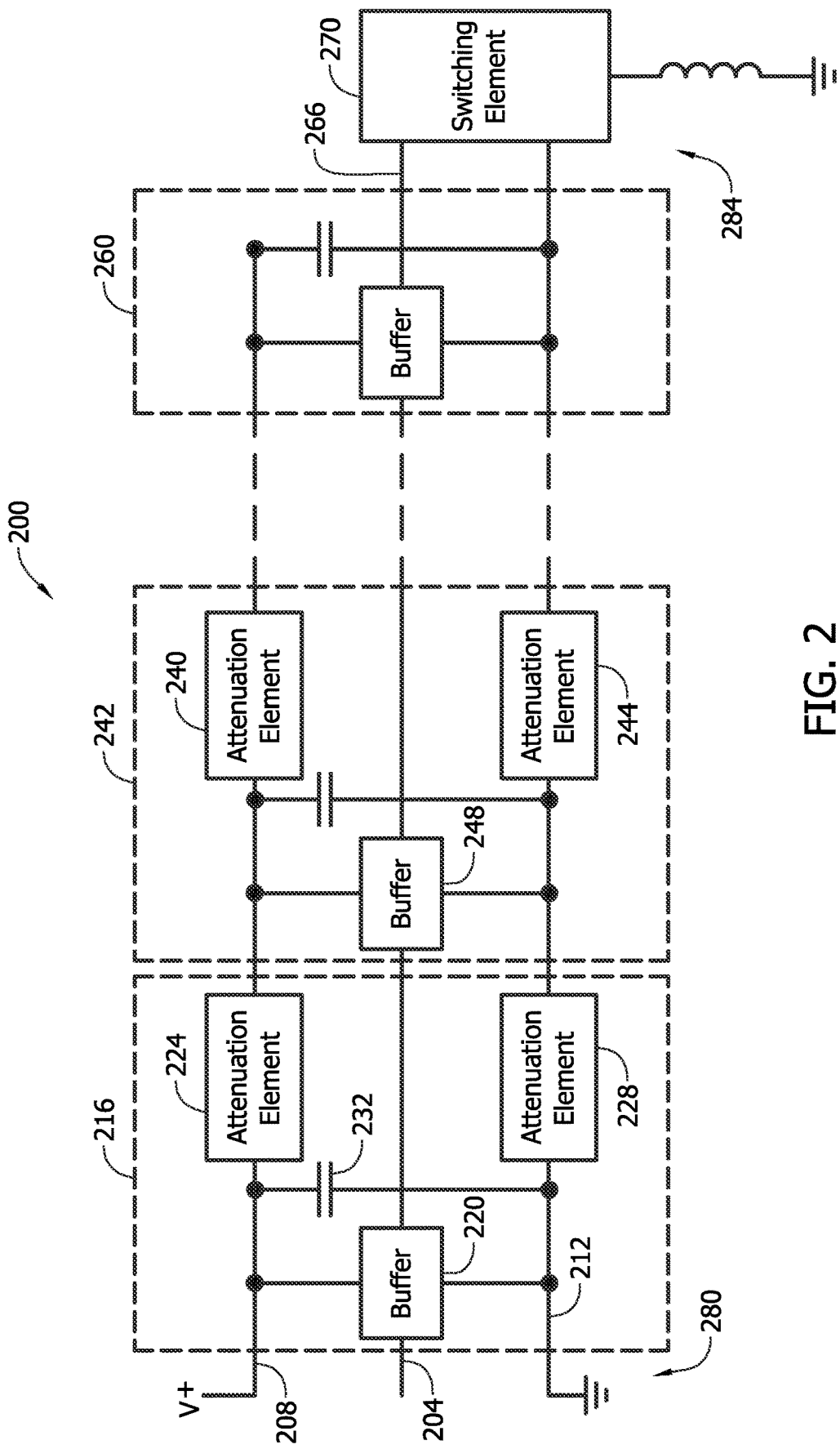
FIG. 2 illustrates a block diagram of buffer chain formed from two or more buffer cells.

FIG. 2 illustrates a block diagram of buffer chain formed from two or more buffer cells. This is but one possible embodiment of a buffer chain configuration. An input 204 connects to a buffer 220 that is part of a buffer cell 216. As shown, is a voltage supply rail or node 208 and a ground rail or node 212 connect to each buffer 220, 248 of each buffer cell 216, 242 to provide power to the buffers. Thus, each buffer has its own isolated power connection or supply such that each connection is separated by the attenuation element. Also part of the buffer cell 216 is a representative capacitor 232 (or other charge storage device) and attenuation elements 224, 228. The attenuation element 224 is series connected in the voltage supply rail 208, while the attenuation element 228 is series connected in the ground rail 212. The voltage supply rail attenuation element 224 connects to an attenuation element 240 in the adjacent buffer cell 242. Similarly, attenuation element 228 connects to attenuation element 244 in the adjacent buffer cell 242. The attenuation elements may comprise resistors or any other device(s) which attenuates or dissipates a signal.

This pattern of buffer cells 216, 242 continues up to buffer cell 260 such that one or more buffer cells may be chained together with attenuation elements also connected in series as shown in the ground rail 212 and voltage supply rail 208. Each buffer cell 216, 242, 260 may be similarly configured or may have a different structure. Any number of buffer cells 216, 242, 260 may be chained together as shown. An output node 266 is provided from the last buffer cell 260 such that the output node connects to a switching element 270 (such as but not limited to a transistor). The ground rail 212 also connects to the switching element 270. Although shown with a buffer, the device could be any type buffer, an inverter, (inverting or non-inverting), or similar device, or an op amp (although too slow for most applications). The switching element 270 could be any type switching element such as but not limited to any type MOSFET, a silicon switch, silicon carbide, gallium nitride switch, any semiconductor switching device that has a high rate of on and off switching, or any device that generates noise.

The ground rail or node at area 280 may be considered as the clean domain or having less noise due to its distance or separation from the switching element 270. The ground rail or node at area 284 may be considered as dirty domain or having more noise due to its distance or separation from the switching element 270. In some prior art systems, even over a short distance of an inch or a few centimeters, the noise could be 10 or 20 volt difference between area 280 and area 284.

In operation, the switching element 270 will create noise as part of its switching operation and due inherent parasitic inductance. The noise from the switching element 270 will appear as a voltage ringing and will couple into the ground rail 212. In the prior art, this noise that couples on the ground rail 212 interferes with buffer operation causing the buffer to switch high due to noise and an actual high logic level at the buffer's input. In the prior art this would cause the buffer to output an unintended high logic level signal (turn on) or voltage magnitude, which in turn can activate the switching element 270. It is also contemplated that the noise may prevent the buffer from turning on, or cause the buffer to erroneously turn off.

In the embodiment of FIG. 2, noise from the switching element 270 that couples into the ground rail is spread over and attenuated by each of the attenuation elements 228, 244 in the buffer stages 216, 242, 260. As a result of the one or more attenuation elements and buffer stages, the voltage drop across each attenuation element is less than the total noise signal. For example, if there were five buffer cells, then the voltage across each attenuation element would be $\frac{1}{5}^{th}$ of the total voltage swing of the noise, which effectively reduces the noise presented to each buffer by a factor of 5. A different number of buffer cells would result in a different degree of noise division across each attenuation element. Because each buffer cell sees only a fraction of the total noise (voltage swing), the noise voltage seen by each buffer cell is not of sufficient magnitude to interfere with buffer operation.

Figure 3A:
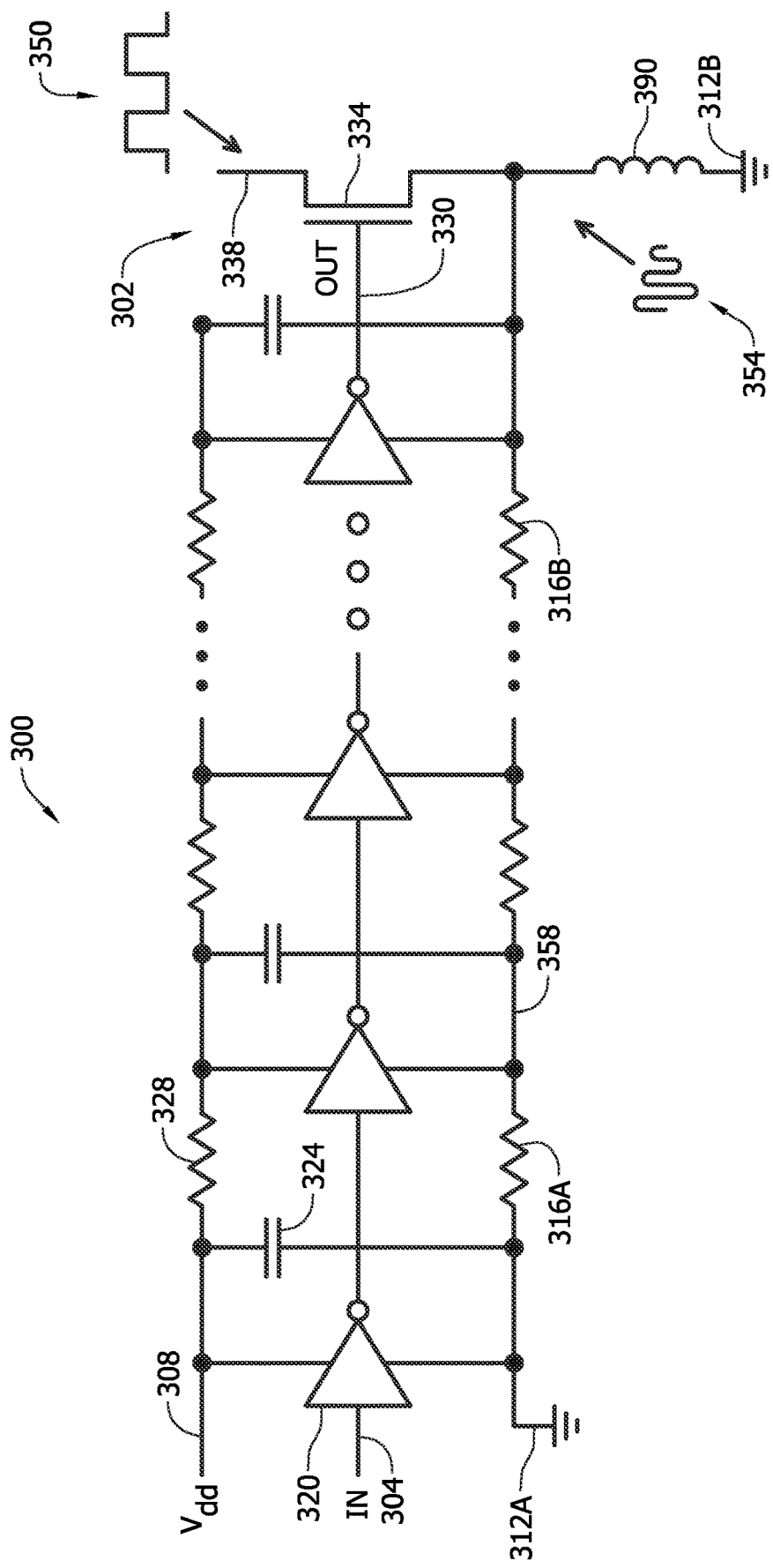
FIG. 3A illustrates an exemplary circuit diagram of the noise tolerate buffer circuit.

FIG. 3A illustrates an exemplary circuit diagram of the noise tolerant buffer circuit. This is but one possible circuit implementation and it is contemplated that other embodiments and configurations are possible. As shown, a cascaded buffer circuit 300 connects to a switching transistor 302. The cascaded buffer circuit 300 includes an input 304, which may receive an input signal from a processor, controller, CPU, any other control device, or any device configured to provide a signal to a prior art buffer. A voltage supply rail 308 and ground rail 312A, 312B are also shown. The ground rail 312A, 312B may be provided by the element driving the input, causing the ground rail 312A, 312B to be a remote ground. As is understood in the art, a ground rail or node may extend throughout an integrated circuit and connect to multiple different sub-circuits, elements, or systems.

As described in connection with FIG. 2, the input 304 feeds into a buffer 320 which is also connected between the voltage supply rail 308 and the ground rail 312A, 312B. The output of the buffer 320 connects to additional buffers in the chain, while a capacitor 324 connects between the voltage supply rail 308 and the ground rail 312A, 312B as shown. The capacitor 324 functions as an energy storage device for the inverter element in the buffer to power switching in the inverter. Series connected with the voltage supply rail 308 and the ground rail 312A, 312B are resistors 328, 316.

The buffer 320, capacitor 324, and resistors 328, 316 may be considered as a buffer cell. Multiple buffer cells may be cascaded or chained together to form the structure as shown referred to as a buffer cell chain, or buffer chain. The cascaded buffer circuit 300 includes an output 300 that connects to the switching transistor 302. The switching transistor 302 includes a FET 334 that has a gate terminal connected to the last buffer output 330 and an output terminal 338. The source terminal of the FET 334 connects to a ground node 312B and a parasitic inductance is represented by inductor 390. The FET 334 may be referred to generally as a power device or switching device (which generates noise that couples into the ground rail).

During operation, an input signal, such as a switching control signal, is provided to the input 304 of the buffer 320 found in the first buffer cell. The signal passes through the buffer cells to the gate of the transistor 334 (such as for example a FET) at the last buffer cell output 330. The input to the transistor 334 cases the transistor to periodically switch on and off to form the output waveform 350 on the output 338.

Due to the inherent high capacitance from a gate terminal to a source terminal of the FET 334, noise is generated in at least the form of a ringing noise and/or overshoot that couples into the ground rail 358 near the transistor 334. The voltage at the ground location 312A may not be the same as the voltage at ground location 358 or location 312B. For example, the ground at ground location 312A may be clean (low noise) while the ground at location 312B may be dirty (noisy). To high of a noise voltage swing at ground location 358 can incorrectly trigger buffers (invertors or other elements) on/off. The noise magnitude at node 312A may be very different from the noise at node 358 and 312B.

In addition, the faster the transistor 334 is switched, the larger the change in voltage from gate to source terminals. This results in a higher noise value. The following equation defines the noise at nide 358.

$$\text{Noise} = \Delta V = L * \frac{\Delta I}{\Delta t}$$

Thus, the amount of noise is based on the inductance values represented by inductor 390 times the switched current, divided by the rate of change of the current. In applications where the current changes over time, such as during the switching event, and the delta current is large, then the noise spikes will also be large. In addition, if the switching transition is fast, then delta t (time) will be small, again leading to a large noise spike. As can be appreciated, many applications in which one or more of these situations are present, will result in large noise magnitude, which this innovation will overcome.

The use of the attenuating resistors 316 in the ground rail 312A, 312B and the numerous buffer stages attenuates and divides the magnitude noise over the course of the ground rail and acts as a voltage divider network such that the total noise magnitude is divided across each resistor into smaller noise pieces such that the noise level at each buffer is not sufficient to switching (on or off) any of the buffers 320 in the chain at a time when switching is not intended. Stated another way, this reduces the total noise signal magnitude seen by each buffer which in turn prevents the noise signal from triggering an unintended buffer transition, which would undesirably generate an output that will turn on the transistor 334. As discussed above, the magnitude of the noise that couples into the ground rail 358 and propagates to the input side of the cascaded buffer circuit 300 is divided across all the resistors in the ground rail based on the number and value of each resistor. Stated another way, the noise is divided across all the buffers/stages in the chain. Thus, the greater the number of resistors (supply and ground) the more the noise voltage will be divided (reduced) at each buffer stage. In addition, it is contemplated that the last buffer could be larger than prior buffers or teach buffer may be sized differently, such as each buffer becoming progressively larger or graduated in size to drive a larger switching device.

Figure 3B:
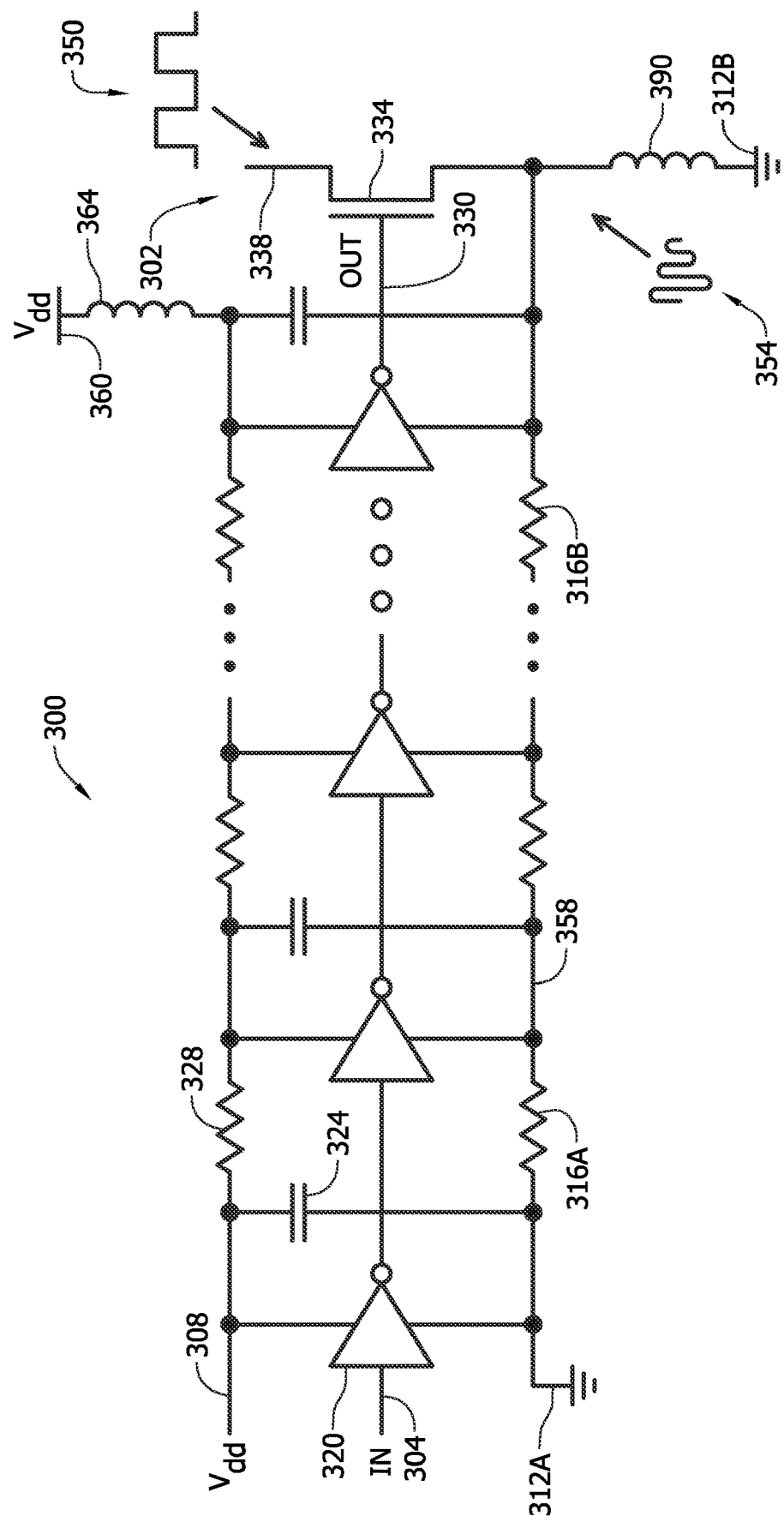
FIG. 3B illustrates an exemplary circuit diagram of the noise tolerant buffer circuit with secondary Vdd connection.

FIG. 3B illustrates an exemplary circuit diagram of the noise tolerant buffer circuit with an optional secondary Vdd connection. As compared to FIG. 3A, identical elements are labeled with identical reference numbers. In this embodiment, a secondary connection 360 to Vdd is provided to connect to the portion of the voltage rail 308 near the switch 334. The Vdd connects to the circuit through an inductor 364. The inductor 364 blocks high frequency noise from polluting Vdd supply, while allowing DC current to pass through.

Providing a secondary Vdd (supply voltage) connection 364 is optional and can be implemented when the current at the secondary Vdd connection 364 is too small due to the resistances 328 in the supply voltage rail 308 are sized (large) to cause a drop in current. This causes a voltage drop that can affect circuit operation, such as the supply voltage to the buffers and/or the switching device.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

The invention claimed is:

1. A noise tolerant switching system comprising:
an input configured to receive a control signal;
a buffer chain comprising:
first buffer cell configured to receive the control signal, the first cell connected to a voltage supply rail and a ground rail;
one or more additional buffer cells arranged in series after the first buffer cell, such that the one or more additional buffer cells receive a buffer cell output from a prior buffer cell, and each of the one or more additional buffer cells are connected to the voltage supply rail and the ground rail, such that a final buffer cell of the one or more additional buffer cells outputs a switch control signal;
two or more series connected ground rail resistors in the ground rail;
two or more series connected voltage supply rail resistors in the voltage supply rail;
two or more capacitors connected between the ground rail and the voltage supply rail;
a switching device having an output terminal and a ground connection to the ground rail, the switching device configured to receive the switch control signal from the final buffer cell, such that during operation of the switching device, switching noise couples into the ground rail and the switching noise is divided across the two or more series connected ground rail resistors in the ground rail to reduce the noise presented to each buffer cell which prevents unwanted triggering of the buffer cell due to noise.

2. The switching system of claim 1 wherein values of the two or more series connected ground rail resistors, the two or more series connected voltage supply rail resistors, and the two or more capacitors are selected to divide noise seen by each buffer to a noise level that will not turn the buffer on or off, and each buffer cell has an associated ground rail resistor, voltage supply rail resistor, and capacitor.

3. The switching system of claim 1 wherein the two or more capacitors comprise local supply decoupling capacitors connected between a local supply rail and a local ground rail in each buffer cell.

4. The switching system of claim 1 wherein the switching device comprises a FET.

5. The switching system of claim 1 further comprising a secondary voltage supply connection to the voltage supply rail.

6. The switching system of claim 1 wherein the switch control signal is received from a processor or a controller.

7. The switching system of claim 6 wherein the buffer chain performs impedance matching between the processor or controller and the switching device.

8. A method for operating a switching device in an environment having noise on a ground rail comprising:
providing:
a buffer chain having two or more series connected buffers;
a buffer chain input configured to receive a switching control signal;
a ground rail with two or more series connected ground rail resistors;
a voltage supply rail with two or more series connected voltage supply rail resistors;
a switching device having a control terminal connected to an output of a last buffer in the buffer chain;
processing the switch control signal through the buffer chain;
presenting the switch control signal to the control terminal of the switching device;
responsive to the switching control signal, turning on and off the switching device to generate an output signal wherein the switching generates noise that couples onto the ground rail; and dividing the noise, based on a number of ground rail resistors and supply rail resistors, between the ground rail resistors and supply rail resistors, to thereby reduce the noise presented to each of the buffers in the buffer chain.

9. The method of claim 8 wherein the buffers in the buffer chain perform impedance matching between the switching device and a device which generates the switch control signal.

10. The method of claim 8 wherein at least one ground rail resistor is associated with each buffer and at least one supply voltage rail resistor is associated with each buffer.

11. The method of claim 8 wherein the switching device comprises a transistor.

12. The method of claim 8 wherein a number of buffers, and associated resistors, in the buffer chain is sufficient to establish that a noise magnitude, generated by the switching, divided by the number of buffers is less than a turn on voltage of the buffers.

13. The method of claim 8 wherein the output signal is pulse width modulated by the switch control signal.

14. A noise tolerant buffer circuit configured to interface a controller to a switching device comprising:
   an input configured to receive a control signal, the control signal functioning as a control signal for a switching device; and
   a first buffer cell having a first buffer cell input and a first buffer cell output, the first buffer cell configured to receive and process the control signal to generate a first buffer cell output;
   a second buffer cell having a second buffer cell input and a second buffer cell output, the second buffer cell configured to receive and process the first buffer cell output to generate a second buffer cell output;
   the switching device configured to receive and perform a switching operation based on the second buffer cell output, wherein the switching operation generates noise that couples back to the first buffer cell and the second buffer cell, and the noise is divided between the first buffer cell and the second buffer cell to thereby reduce the noise to a magnitude that does not trigger the first buffer cell or the second buffer cell.

15. The circuit of claim 14 further comprising one or more additional buffer cells which further divide the noise to a magnitude that does not trigger the first buffer, the second buffer, or the one or more additional buffers.

16. The circuit of claim 14 wherein the first buffer cell and the second buffer cell comprise:
   an input configured to receive the control signal from the controller;
   a buffer configured to impedance match between the controller and the switching device such that the buffer connects to a voltage supply rail and a ground rail;
   a ground rail attenuation element series connected in the ground rail;
   a voltage supply attenuation element series connected in the voltage supply rail
   a capacitor connected between the voltage supply rail and the ground rail; and
   an output.

17. The circuit of claim 16 wherein the voltage supply rail further comprises a secondary supply voltage connection.

18. The circuit of claim 14 wherein the controller comprises a processor that is unable to directly connect to the switching device due to impedance mismatch.

19. The circuit of claim 14 further comprising one or more additional buffer cells, wherein a total number of buffer cells is sufficient to establish a noise magnitude, generated by the switching, divided by the number of buffers, be less than a turn on voltage of the first buffer cell, the second buffer cell, and the one or more additional buffer cells.

20. The circuit of claim 14 wherein the switching device is an FET.

* * * * *